(12) United States Patent
Koduri et al.

(10) Patent No.: US 6,510,240 B1
(45) Date of Patent: *Jan. 21, 2003

(54) AUTOMATIC DETECTION OF DIE ABSENCE ON THE WIRE BONDING MACHINE

(75) Inventors: Sreenivasan Kalyani Koduri, Dallas, TX (US); David Ho, Richardson, TX (US); Yee Hsun U, Richardson, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/437,762

(22) Filed: May 9, 1995

(51) Int. Cl.[7] .................................................. G06K 9/00
(52) U.S. Cl. ....................................... 382/146; 382/151
(58) Field of Search ................................ 382/141, 142, 143, 144, 145, 146, 147, 148, 149, 150, 151, 152, 153, 170; 348/86, 87, 91, 92, 94, 95, 125, 126, 129

(56) References Cited

U.S. PATENT DOCUMENTS

| | | | |
|---|---|---|---|
| 4,852,131 A | * 7/1989 | Armistead ..................... 378/4 |
| 5,030,008 A | * 7/1991 | Scott et al. ................. 356/394 |
| 5,119,436 A | * 6/1992 | Holdgrafer ................... 382/146 |
| 5,125,036 A | * 6/1992 | Raghavan et al. .......... 382/146 |
| 5,235,649 A | * 8/1993 | Reda ........................... 382/143 |
| 5,265,200 A | * 11/1993 | Edgar .......................... 382/169 |
| 5,273,040 A | * 12/1993 | Apicella et al. ............. 600/410 |
| 5,343,538 A | * 8/1994 | Kasdan ........................ 382/165 |
| 5,369,715 A | * 11/1994 | Tanaka et al. .............. 382/170 |
| 5,410,613 A | * 4/1995 | Suzuki ........................ 382/159 |
| 5,454,043 A | * 9/1995 | Freeman ..................... 382/168 |
| 5,467,411 A | * 11/1995 | Tanaka et al. .............. 382/113 |
| 5,555,319 A | * 9/1996 | Tsubusaki et al. .......... 382/170 |
| 5,570,298 A | * 10/1996 | Suzuki et al. ............... 382/170 |

* cited by examiner

Primary Examiner—Andrew W. Johns
Assistant Examiner—Duy M. Dang
(74) Attorney, Agent, or Firm—W. Daniel Swayze, Jr.; W. James Brady; Frederick J. Telecky, Jr.

(57) ABSTRACT

An apparatus detects the presence or absence of a semiconductor device. The apparatus includes a wire bonding machine to form a connection with the semiconductor device, and a camera to form an image of a position of the semiconductor device. A processor controls the wire bonding machine and transforms the image to pixel data. Additionally, the processor converts the pixel data to discrimination data to indicate whether the semiconductor device is present. The processor controls the wire bonding machine in accordance with the presence or the absence of the semiconductor device.

15 Claims, 3 Drawing Sheets

AUTOMATIC DETECTION OF DIE ABSENCE ON THE WIRE BONDING MACHINE

FIELD OF THE INVENTION

The present invention relates to pattern recognition systems, and more particularity to the pattern recognition systems that are used in-conjunction with the wire bonding machine for bonding opposite ends of wires to a semiconductor chip and lead frame.

BACKGROUND OF THE INVENTION

Conventionally, wire bonding machines are widely used for connecting a semiconductor chip to a lead frame by bonding opposite ends of a plurality of wires such as gold wires to a semiconductor integrated circuit chip and innerleads of a lead frame, respectively for manufacturing a semiconductor package. These wires are used as input connections to the integrated circuit chips. The lead frame often are sufficiently robust to be inserted into a printed circuit board and soldered to conductors on the board.

These semiconductor packages are used with miniature electronic circuits or micro circuits which are used in vast quantities in a wide variety of consumer, commercial, industrial and military apparatus. The majority of such microcircuits are of the type referred to as integrated circuits. These integrated circuits include a large number of active circuit elements such as transistors and passive elements such as resistors and capacitors. In semiconductor integrated circuits, conductive paths between circuit elements on a semiconductor substrate are formed by selectively etching the substrate. In hybrid micro-circuit circuit elements mounted on a ceramic substrate are usually interconnected, typically by conductive ink paths on the substrate.

The functional portions of integrated circuits are typically in the form of very small, rectangular-shaped chips, ranging in size from 0.025 inch to 0.200 inch or more on a side.

Conventional semiconductor wire bonders use X-Y tables to move the bond head over the semiconductor devise for bonding lead wires between the by semiconductor device, to its lead frame fingers. Sometimes, the lead frame is replaced by other appropriate electrical connections such as a ceramic package, hybrid circuit or other semiconductor device. The X-Y coordinate tables are driven by complex mechanical components that convert the rotatory motion of the axis drive motor to control linear motion. The bond head carries several components such as a Z-axis drive motor, a camera for vision functions and other components required to bond the lead wires. A camera or vision apparatus may be mounted at the pivot point of the bond head frame and views the bonding area through lenses and 45° mirror prisms.

The lead frame is moved or "index" to a location where an accurately cut piece of thermoset film is attached precisely to the bottom side of the lead frame.

This camera or pattern recognition apparatus are widely used in modem manufacturing processes to position work items with precision. In the manufacture of hybrid integrated circuits, for example, such equipment is frequently incorporated in the automatic wire bonding machines. Components must be positioned within an acceptable precision before bonding takes place less connections be mislocated and produces results which either require repair or must be discarded.

The pattern recognition apparatus may include a television camera for creating an image of the work item and a processor for converting the image of the work item to digital form. The processor uses selected threshold values to determine which gray value is to be digitized as black instead of white. The picture or image elements (referred to in the art as pixels) of the digitized imaged are compared with those of a digitized reference image of the work items stored in memory. The pattern recognition apparatus then not only generates off set coordinates, giving the apparent location of a work item image with reference to a base location, but also generates a quality number representing the extent of match between pixels of the digitized work item image and those of the digitized reference image. If the quality number is at least as large as a predetermined quality reference level the offset coordinates are accepted as correct and used to control servo mechanism which positions the work item.

FIG. 1 illustrates a matrix lead frame 100 with two missing dies. The wire bonding machine operates according to the algorithm illustrated in FIG. 2. At die position 101 alignment with the die is attempted and a successful bond is achieved The bonding machine moves to die position 103. Alignment is achieved with the die, with the wires being bonded, and the bonding machine moves to die 105. Again alignment is achieved, and the wires are bonded to die 105. The bonding machines moves to die position 107. At die position 107, the bonding machine is aligned at die position 107, and wires are bonded at die position 107. Next, the bonding machine moves to die position 109. However, when alignment is attempted at the position, the alignment can not be made and the bonding machine stops for manual assistance. When the machine stops for manual assistance, labor costs increase, machine utilization of the bonding machine, decreases and yield of bonded dies decreases. However, in a great many cases, the problem with the alignment is not the fact that a die is actually missing, but the problem is that the bonding machine confuses the absence of the die with either a combination of die and epoxy or a combination of die and die pad.

SUMMARY OF THE INVENTION

The present invention provides a bonding machine with a pattern recognition apparatus that can discriminate between a die, and epoxy or a die pad or any of the combinations. By more accurately determining whether or not a die is present, increased manpower can be realized, the utilization of the bonding machine can be increased and the yield of semiconductor bonded to lead frames can be sufficiently increased. The present invention converts pixel data to discrimination data that can be employed to discriminate between die, die pad or epoxy The present invention converts the pixel data to gray level data and gray level variation data in order to obtain the discrimination data. The present invention by utilization of gray level and gray level variation in combination with several test algorithms determines the discrimination data in order to obtain a high degree of accuracy of whether a die, epoxy or die pad or any of the combination of the above are present.

DETAIL DESCRIPTION OF THE DRAWINGS

DETAIL DESCRIPTION OF THE INVENTION

The present invention more accurately detects the presence or absence of a die in a matrix lead frame, avoiding unnecessarily stopping the operation of the wire bonding machine.

Figure 1:
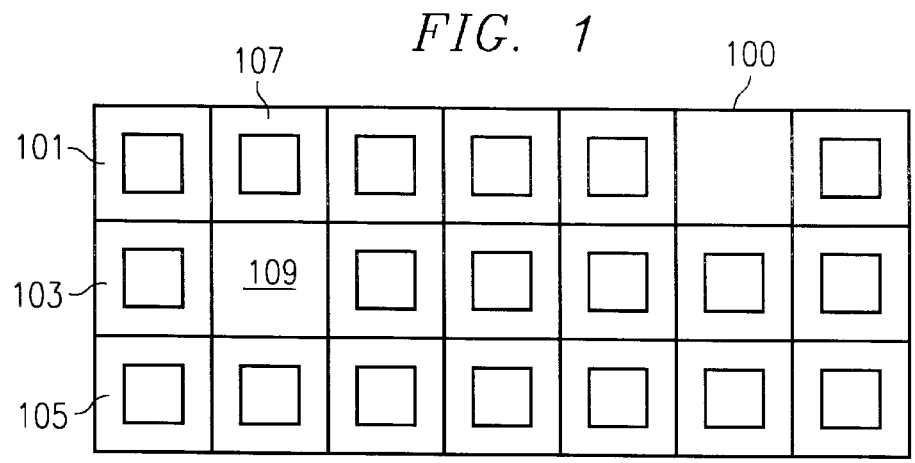
FIG. 1 illustrates a matrix lead frame.
Figure 2:
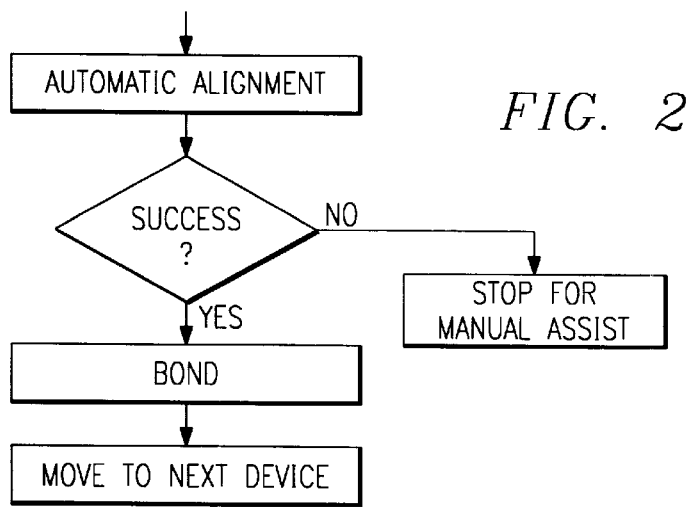
FIG. 2 illustrates a wire bonding process.
Figure 3:
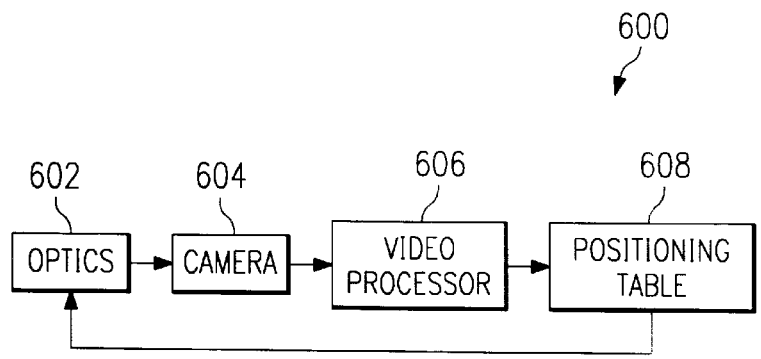
FIG. 3 illustrates an apparatus of the present invention.

The present invention converts pixel data to discrimination data in order to detect the presence or absence of the die. The pixel data obtains the discrimination data by converting the pixel data to gray scale data or gray scale variation data to obtain the discrimination data. A digitized pattern recognition apparatus 600 is illustrated in block form in FIG. 3.

The digitized pattern recognition apparatus 600 includes optics 602, which is connected to camera 604 to aid the camera in obtaining an image; television camera 604, which is connected to video processor 606, to obtain an image of the die; video processor 606 to convert the image to pixel data and to process the pixel data and a programmable positioning table 608 which is controlled by the processor in accordance with the pixel data. By way of example, these components function together as a portion of a automatic wire bonding machine (not shown) to position a work item for example a power transistor on a printed circuit board so that the wire bonding connections can be made with the needed degree of precision. Specifically, optic 602 focus on the work item and camera 604 obtains an image of the work item which is converted into digital form by video processor 606.

The interactive nature of the various components of the pattern recognition apparatus 600 is indicated by arrows from positioning table 608 to camera 604 to video processor 606 and to positioning table 608.

Video processor 606 stores in a memory of the video processor 606, either a "1" or "0" for each pixel in the video image depending on whether the pixel is observed as black or white.

Figure 4:
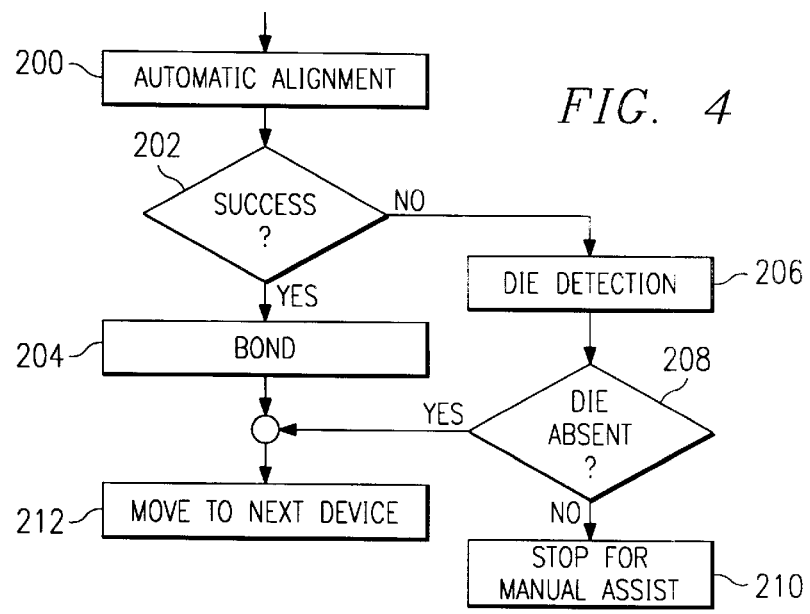
FIG. 4 illustrates an overall flow chart of the wire bonding process.

The video processor 606 operates in accordance with the flow chart as illustrated in FIG. 4. In block 200 automatic alignment is attempted. In decision block 202, the automatic wire bonding machine determines if the automatic alignment was a-success. This determination is based if the processor 606 detects a die only after a determination that the automatic alignment was in fact a success. The automatic wire bonding machine, in block 204, bonds the wires to the lead frames. In block 212, the automatic wire bonding machine moves to the next device by moving to the next die on the matrix lead frame.

If the automatic alignment was not a success as a result of decision block 202, the automatic wire bonding machine in block 206 determines whether a die is present with another device. In decision block 208, if the die is absent, the automatic wire bonding machine stops for manual assistance by transferring control to block 210. If the die is absent, then the automatic wire bonding machine moves to the next position of the matrix lead frame in block 212.

Figure 5:
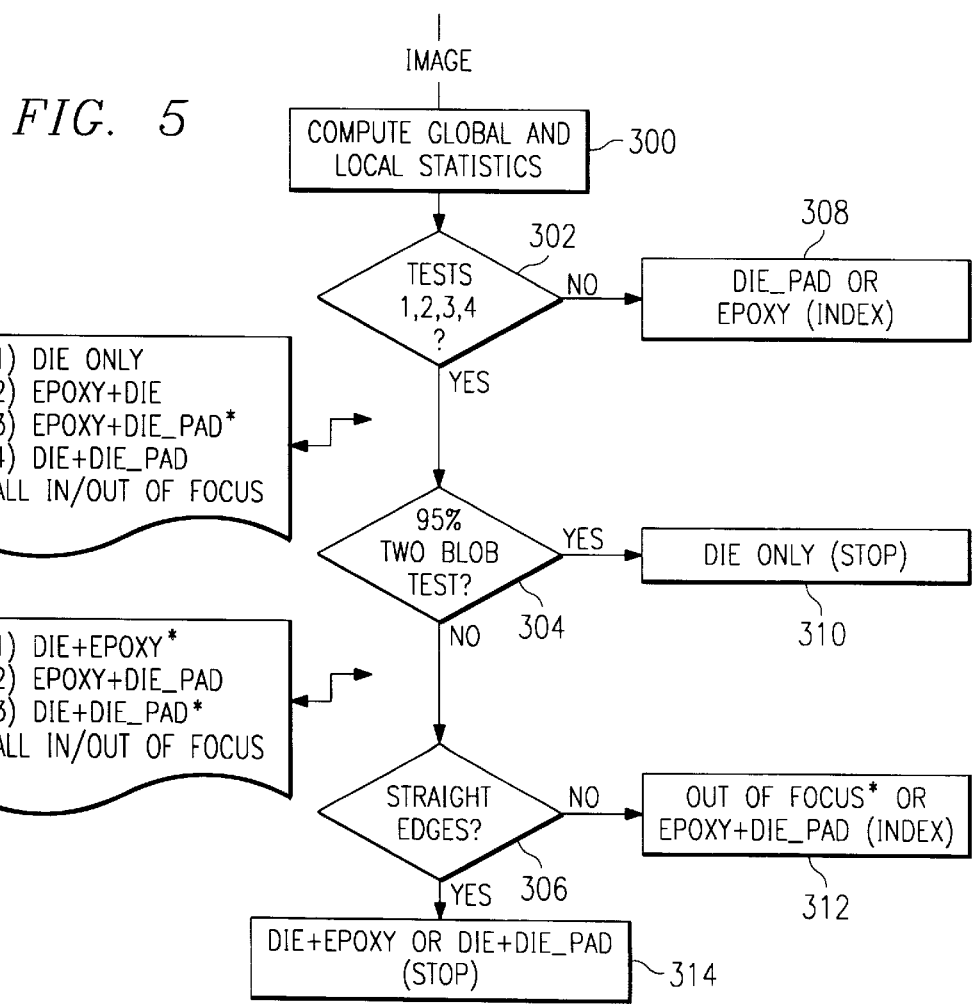
FIG. 5 illustrates a flow chart for the die detection process.

FIG. 5 illustrates the process to determine if a die is absent. The die detection process as illustrated in FIG. 5 determines if a die or a portion of a die is within the field of view (FOV) of the camera 604. In general, there are six cases or possibilities that the image from the camera 604 may represent. The six cases are: first, the image is of a full die, second, the image is a full die pad, third, the image is fill epoxy, fourth, the image is epoxy plus die, fifth, the image is epoxy plus die pad and lastly sixth, the image is die plus die pad.

Additionally, the image can be taken under varying light conditions and varying focus conditions. For example, the light can vary from a very dark light to a very bright light. Additionally, the focus can vary from a very sharp focus to an image which is highly out of focus. These factors may contribute to the processor 606 being able to detect a die when a die is in fact present. However, the processor 606 may be able to successfully detect a die through the processing of discrimination data including gray scale and gray level variation data. These factors may combine to accurately determine if a die is present or absent. When these conditions occur, namely varying light and varying focus condition, it is possible to detect either the presence or the absence of a die through a series of tests including mathematical algorithms employing the gray level.

FIG. 5 illustrates the die detection process. In block 300, the global and local statistics based upon exemplatory gray levels are computed by the processor 606. In block 302, various tests based on the gray levels are executed to determine if the image is a die, die pad or epoxy or combination thereof. If the test from decision block 302 are satisfactory then the six alternatives have been narrowed to four; namely, the image is only die; the image is epoxy plus die; the image is epoxy plus die pad or the image is die plus die pad. Next, in decision block 304, a two blob test is executed. If this test is successfully executed then the image is a die only as in block 310, and then the automatic wire bonding machine stops. If this test is not satisfactory, then the image is tested for straight edges in decision block 306. If there are not straight images present, then either the image is out of focus or there is epoxy plus a die pad as illustrated in block 312. If there is straight edges then the result is the die with the epoxy or the die with die pad in block 314, and the automatic wire bonding machine stops. These test are illustrated in FIG. 6 and 7.

Figure 6:
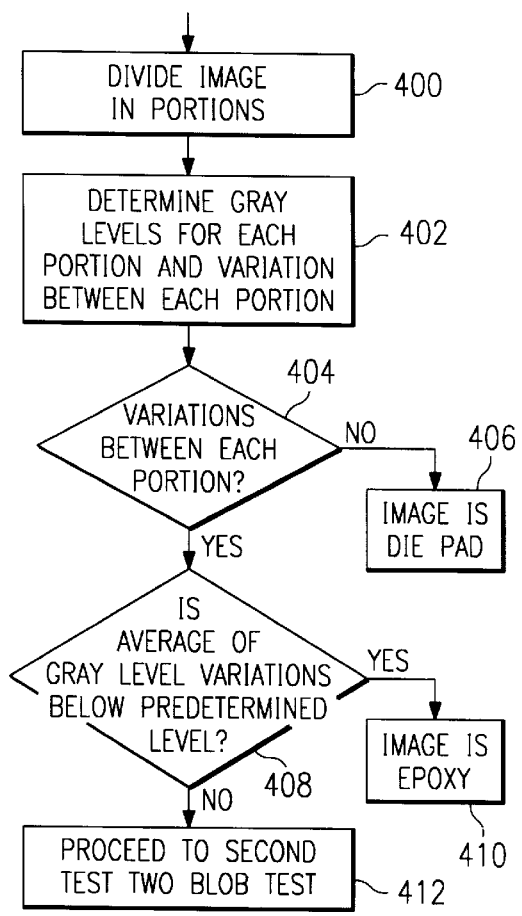
FIG. 6 illustrates a first series of tests corresponding to the die detection process.

As illustrated in FIG. 6, the image from the camera may be divided into a plurality of portions. Exemplary, the image may be divided 50 to 100 portions which may all be of equal areas. In block 402, the gray levels for each of these portions is obtained, and the variations of these gray levels between each of the portions is obtained. If these portions are uniform in gray level variations then the image is classified as a die pad. The decision block 404 determines the variations between the portions, and in block 406, the image is determined to be a die pad if there is no variations between each of the portions. Next, the processor 606 determines if the image is a die pad. If the average of the gray level is below a predetermined threshold value then the image is the die pad. Next, as illustrated in FIG. 6, and in block 408 if the average of the gray level variations are below a predetermined level then the image is an epoxy as in block 410 otherwise the two blob test is executed in block 412. Additional tests are the local mean of the gray level local standard deviation of the gray level the mean of local standard deviation of gray level the standard deviation of local standard deviation In operation as the automatic wire bonding machine moves along the matrix lead frame, a position on the matrix lead frame is detected where automatic alignment is not successful. At this position, the image from camera 604 is processed in order to determine if a die is present or not. The image is divided into portions, and gray levels for each of the portion is determined. Next, the variation between each portions of the image is determined, and if the variation is greater than a predetermined variation, then the average of the gray level variations are determined to determine if they are below a second predetermined level. If the average of the gray level variations is below the second predetermined level, then the image is epoxy. If the average of the gray level variations are not below the second predetermined level then the two blob test is executed.

Figure 7:
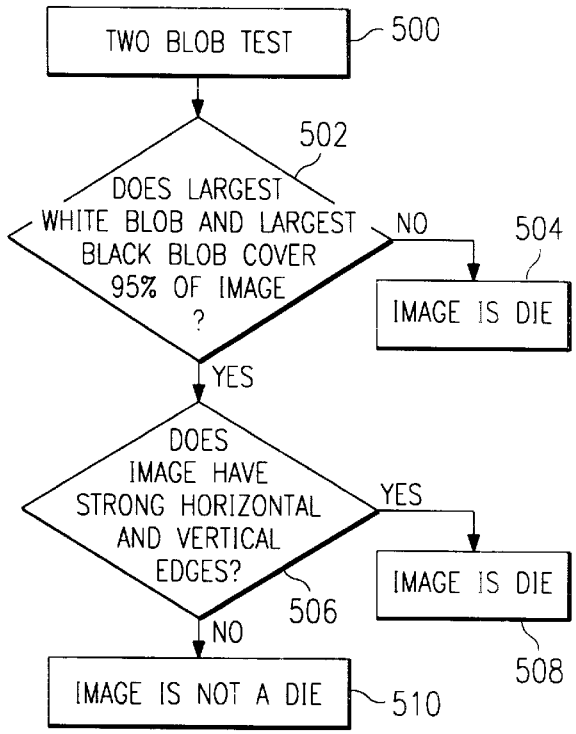
FIG. 7 illustrates the process of the two blob test.
Figure 8:
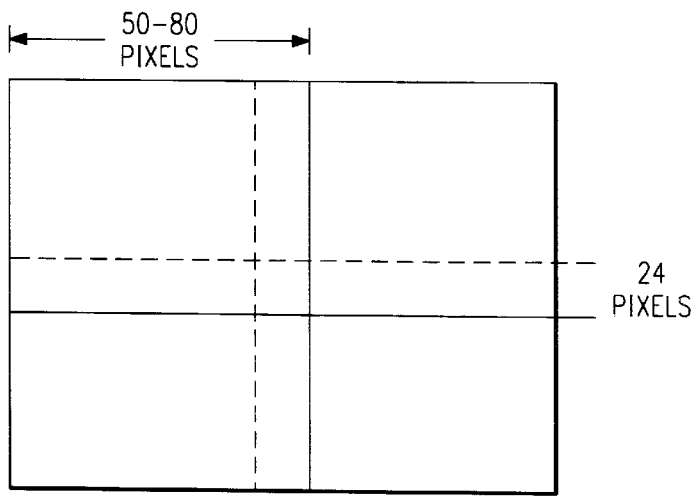
FIG. 8 illustrates a portion of the two blob test.

In FIG. 7, the two blob test is initiated in block 500. In decision block 502, it is determined if the largest white blob, as determined by area and the largest black blob as determined by area, cover at least 95% of the image. Then the image is determined to be a die in block 504. This is based on the fact that images having two blobs namely, only epoxy with a die epoxy plus die pad or die plus die pad. If the image includes strong horizontal and vertical edges then a die is present otherwise there is no die. In block 506, it is determined whether there are strong horizontal and vertical edges within the image. To make this determination, the global gray level mean and standard deviations are first obtained. After the mean and standard deviations have been obtained, then the image is divided into small over lapping blobs or regions (701, 702, 703 and 704) such as illustrated in FIG. 8. Each individual blob is on the order of 50 to 80 pixels. The blobs overlap adjacent blobs by shifting the blobs a predetermined amount, for example, up to 24 pixels in any direction. The image is first divided, for example, into square regions and then both horizontal and-vertical rectangles to distinguish any checkerboard image patterns. In each of the square blobs, for example, horizontal rectangle blobs and vertical rectangle blobs, the mean and standard deviations of the gray levels for each of the individual blobs are obtained. The mean of the local gray level of the individual square, horizontal or vertical blobs provide an indication of the over intensity level of the images this can be used advantageously with other variables. The standard deviation of the local gray level of either the square, horizontal or rectangle blobs provides a indication of the intensity level across the blobs. If it determines that some of the blobs are significantly brighter than others this would indicate the presence of a die and the absence of a die pad. The means of the local gray level standard deviation provides a measure of the uniformity of the subimages. If the sub images or square, rectangle have sharp features or black or white areas this raises this variable.

Next, it is determined if the largest white blob and the largest black blob cover at least 95% of image, if both do not then the image is a die if it does then it is determined if the images has strong horizontal and vertical edges if so then again the image is a die if not then the image is not a die.

What is claimed is:

1. An apparatus for detecting the presence or the absence of a semiconductor device; comprising:
   a wire bonding machine to form a connection with the semiconductor device;
   a camera to form an image of a position of the semiconductor device;
   a processor to control said wire bonding machine, and to transform said image to pixel data and to convert said pixel data to discrimination data to indicate whether said semiconductor device is present or said semiconductor device is absent; and
   wherein said processor controls said wire bonding machine to accept or reject the semiconductor device in accordance with said discrimination data based on said presence or said absence of the semiconductor device.

2. An apparatus for detecting the presence or the absence of a semiconductor device as in claim 1, wherein said discrimination data discriminates between a die and die pad.

3. An apparatus for detecting the presence or the absence of a semiconductor device as in claim 1, wherein said discrimination data discriminates between a die and an epoxy.

4. An apparatus for detecting the presence or the absence of a semiconductor device as in claim 1, wherein said discrimination data discriminates between a die pad and epoxy.

5. An apparatus for detecting the presence or the absence of a semiconductor device as in claim 1, wherein said discrimination data includes gray scale data.

6. An apparatus for detecting the presence or the absence of a semiconductor device as in; claim 1, wherein said discrimination data includes the mean of gray scale data of portions of said image.

7. An apparatus for detecting the presence or the absence of a semiconductor device as in claim 1, wherein said discrimination data includes standard deviations of gray scale data of portions of said image.

8. A method for detecting the presence or absence of a semiconductor device, comprising the steps of:
   controlling a wire bonding machine to form a connection to the semiconductor device;
   forming an image of a position of the semiconductor device with a camera;
   controlling said wire bonding machine with a processor by transforming said image to pixel data to form discrimination data to indicate the presence or the absence of said semiconductor device; and
   wherein said controlling step controls said wire bonding machine to accept or reject the semiconductor device in accordance with said discrimination data based on the presence or absence of said semiconductor device.

9. A method for detecting the presence or absence of a semiconductor device as in claim 8, wherein said formation of said discrimination data includes the step of forming discrimination data to discrimination between a die and a die pad.

10. A method for detecting the presence or absence of a semiconductor device as in claim 8, wherein said formation of said discriminate data includes the step of forming said discrimination data to discriminate between a die and an epoxy.

11. A method for detecting the presence or absence of a semiconductor device as in claim 8, wherein said formation of said discrimination data includes the step of forming said discrimination data to discriminate between epoxy and a die pad.

12. A method for detecting the presence or absence of a semiconductor device as in claim 8, wherein said formation of said discrimination data includes the step of forming gray scale data.

13. A method for detecting the presence or absence of a semiconductor device as in claim 8, wherein said step of forming said discrimination data includes the step of forming a mean of gray scale data of a portion of the image.

14. A method for detecting the presence or absence of a semiconductor device as in claim 8, wherein said step of forming said discrimination data includes the step of forming a standard deviation of gray scale data of a portion of the said image.

15. A system for detecting the presence or the absence of a semiconductor device; comprising:
   a wire bonding machine to form a connection with the semiconductor device;

and a video system comprising:
  a camera to form an image of a position of the semiconductor device;
  a processor to control said wire bonding machine, and to transform said image to pixel data and to convert said pixel data to discrimination data to indicate whether said semiconductor device is present; and
  wherein said processor controls said wire bonding machine to accept or reject the semiconductor device in accordance with said discrimination data based on said presence or said absence of the semiconductor device.

\* \* \* \* \*